United States Patent
Koch et al.

(10) Patent No.: US 11,183,373 B2
(45) Date of Patent: Nov. 23, 2021

(54) MULTI-PATTERNED SPUTTER TRAPS AND METHODS OF MAKING

(71) Applicant: Honeywell International Inc., Morris Plains, NJ (US)

(72) Inventors: James L. Koch, Spokane Valley, WA (US); Jacob C. Ruzicka, Spokane, WA (US)

(73) Assignee: Honeywell International Inc., Charlotte, NC (US)

(*) Notice: Subject to any disclaimer, the term of this patent is extended or adjusted under 35 U.S.C. 154(b) by 517 days.

(21) Appl. No.: 16/149,416

(22) Filed: Oct. 2, 2018

(65) Prior Publication Data
US 2019/0108988 A1  Apr. 11, 2019

Related U.S. Application Data

(60) Provisional application No. 62/570,842, filed on Oct. 11, 2017.

(51) Int. Cl.
| | |
|---|---|
| *H01J 37/32* | (2006.01) |
| *H01J 37/34* | (2006.01) |
| *C23C 14/56* | (2006.01) |
| *C23C 14/35* | (2006.01) |

(52) U.S. Cl.
CPC ...... *H01J 37/32871* (2013.01); *C23C 14/564* (2013.01); *H01J 37/3411* (2013.01); *C23C 14/35* (2013.01)

(58) Field of Classification Search
CPC .................................................. C23C 14/564
See application file for complete search history.

(56) References Cited

U.S. PATENT DOCUMENTS

| | | |
|---|---|---|
| 5,096,449 A | 3/1992 | Matsuzaki |
| 5,178,739 A | 1/1993 | Barnes et al. |
| 5,391,275 A | 2/1995 | Mintz |
| (Continued) | | |

FOREIGN PATENT DOCUMENTS

| | | |
|---|---|---|
| CN | 104752138 A | 9/1975 |
| CN | 1681961 A | 10/2005 |
| (Continued) | | |

OTHER PUBLICATIONS

International Preliminary Report on Patentability issued in PCT/US2016/042740, dated Nov. 14, 2017, 9 pages.

(Continued)

*Primary Examiner* — John J Brayton
(74) *Attorney, Agent, or Firm* — Faegre Drinker Biddle & Reath LLP

(57) ABSTRACT

A sputtering chamber particle trap comprises first and second patterns formed on at least a portion of a surface of the particle trap. The first pattern includes one of: first indentations having a first depth and separated by first and second threads, and first ridges having a first height and separated by first and second grooves. The second pattern is formed on at least a portion of the first pattern and includes one of: second indentations having a second depth and separated by third and fourth threads, and second ridges having a second height and separated by third and fourth grooves. A method of forming a particle trap on a sputtering chamber component is also disclosed.

20 Claims, 9 Drawing Sheets

(56) References Cited

U.S. PATENT DOCUMENTS

| | | |
|---|---|---|
| 5,399,372 A | 3/1995 | Grimes et al. |
| 5,474,649 A | 12/1995 | Kava et al. |
| 5,522,245 A | 6/1996 | Nozaki et al. |
| 5,614,071 A | 3/1997 | Mahvan et al. |
| 5,837,057 A | 11/1998 | Koyama et al. |
| 5,961,793 A | 10/1999 | Ngan |
| 5,993,594 A | 11/1999 | Wicker et al. |
| 6,001,227 A | 12/1999 | Pavate et al. |
| 6,042,700 A | 3/2000 | Gopalraja et al. |
| 6,077,402 A | 6/2000 | Hong et al. |
| 6,117,281 A | 9/2000 | Novbakhtian |
| 6,126,791 A | 10/2000 | Pavate et al. |
| 6,129,808 A | 10/2000 | Wicker et al. |
| 6,139,701 A | 10/2000 | Pavate et al. |
| 6,162,297 A | 12/2000 | Mintz et al. |
| 6,168,696 B1 | 1/2001 | Burton et al. |
| 6,171,455 B1 | 1/2001 | Pavate et al. |
| 6,200,433 B1 | 3/2001 | Ding et al. |
| 6,228,186 B1 | 5/2001 | Pavate et al. |
| 6,235,163 B1 | 5/2001 | Angelo et al. |
| 6,235,169 B1 | 5/2001 | Gopalraja et al. |
| 6,244,210 B1 | 6/2001 | Iacoponi et al. |
| 6,251,793 B1 | 6/2001 | Wicker et al. |
| 6,254,737 B1 | 7/2001 | Edelstein et al. |
| 6,254,746 B1 | 7/2001 | Subramani et al. |
| 6,277,253 B1 | 8/2001 | Narasimhan et al. |
| 6,315,872 B1 | 11/2001 | Pavate et al. |
| 6,344,105 B1 | 2/2002 | Daugherty et al. |
| 6,344,419 B1 | 2/2002 | Forster et al. |
| 6,345,588 B1 | 2/2002 | Stimson |
| 6,348,113 B1 | 2/2002 | Michaluk et al. |
| 6,350,353 B2 | 2/2002 | Gopalraja et al. |
| 6,368,469 B1 | 4/2002 | Nulman et al. |
| 6,371,045 B1 | 4/2002 | Wang et al. |
| 6,394,026 B1 | 5/2002 | Wicker et al. |
| 6,398,929 B1 | 6/2002 | Chiang et al. |
| 6,413,383 B1 | 7/2002 | Chiang et al. |
| 6,451,179 B1 | 9/2002 | Xu et al. |
| 6,451,181 B1 | 9/2002 | Denning et al. |
| 6,461,483 B1 | 10/2002 | Gopalraja et al. |
| 6,464,794 B1 | 10/2002 | Park et al. |
| 6,464,843 B1 | 10/2002 | Wicker et al. |
| 6,506,287 B1 | 1/2003 | Ding |
| 6,506,312 B1 | 1/2003 | Bottomfield |
| 6,582,569 B1 | 6/2003 | Chiang et al. |
| 6,583,064 B2 | 6/2003 | Wicker et al. |
| 6,610,184 B2 | 8/2003 | Ding et al. |
| 6,627,056 B2 | 9/2003 | Wang et al. |
| 6,652,717 B1 | 11/2003 | Hong |
| 6,660,140 B2 | 12/2003 | Buchanan et al. |
| 6,673,724 B2 | 1/2004 | Forster et al. |
| 6,699,375 B1 | 3/2004 | Crocker |
| 6,719,883 B2 | 4/2004 | Stimson |
| 6,783,639 B2 | 8/2004 | Nulman et al. |
| 6,797,109 B2 | 9/2004 | Park et al. |
| 6,812,471 B2 | 11/2004 | Popiolkowski et al. |
| 6,824,658 B2 | 11/2004 | Gopalraja et al. |
| 6,830,622 B2 | 12/2004 | O'Donnell et al. |
| 6,890,861 B1 | 5/2005 | Bosch |
| 6,893,513 B2 | 5/2005 | Michaluk et al. |
| 6,893,541 B2 | 5/2005 | Chiang et al. |
| 6,933,508 B2 | 8/2005 | Popiolkowski et al. |
| 6,942,929 B2 | 9/2005 | Han et al. |
| 6,955,748 B2 | 10/2005 | Kim |
| 6,969,953 B2 | 11/2005 | Schaepkens |
| 6,971,151 B2 | 12/2005 | Buehler |
| 7,026,009 B2 | 4/2006 | Lin et al. |
| 7,041,201 B2 | 5/2006 | Gung et al. |
| 7,119,489 B2 | 10/2006 | Shin et al. |
| 7,160,616 B2 | 1/2007 | Massler et al. |
| 7,163,603 B2 | 1/2007 | Fink |
| 7,208,878 B2 | 4/2007 | Shin et al. |
| 7,220,497 B2 | 5/2007 | Chang |
| 7,229,510 B2 | 6/2007 | Nakamura |
| 7,247,888 B2 | 7/2007 | Ogihara et al. |
| 7,252,738 B2 | 8/2007 | Tong et al. |
| 7,300,537 B2 | 11/2007 | O'Donnell et al. |
| 7,311,784 B2 | 12/2007 | Fink |
| 7,311,797 B2 | 12/2007 | O'Donnell et al. |
| 7,318,879 B2 | 1/2008 | Kwon et al. |
| 7,332,426 B2 | 2/2008 | Ikeda et al. |
| 7,364,623 B2 | 4/2008 | Cirigliano |
| 7,371,467 B2 | 5/2008 | Han et al. |
| 7,374,648 B2 | 5/2008 | Hom et al. |
| 7,378,001 B2 | 5/2008 | Goergens et al. |
| 7,407,565 B2 | 8/2008 | Wang et al. |
| 7,430,986 B2 | 10/2008 | Dhindsa et al. |
| 7,431,782 B2 | 10/2008 | Michaluk et al. |
| 7,438,018 B2 | 10/2008 | Son |
| 7,455,748 B2 | 11/2008 | Keil et al. |
| 7,569,125 B2 | 8/2009 | Gung et al. |
| 7,585,380 B2 | 9/2009 | Michaluk et al. |
| 7,618,516 B2 | 11/2009 | Bera et al. |
| 7,618,769 B2 | 11/2009 | Brueckner et al. |
| 7,658,816 B2 | 2/2010 | Koshiishi et al. |
| 7,674,353 B2 | 3/2010 | Bera et al. |
| 7,696,697 B2 | 4/2010 | Kuwahara et al. |
| 7,713,364 B2 | 5/2010 | Nakamura |
| 7,762,114 B2 | 7/2010 | Abney et al. |
| 7,767,054 B2 | 8/2010 | Kobayashi et al. |
| 7,772,111 B2 | 8/2010 | Ikeda et al. |
| 7,802,539 B2 | 9/2010 | Bosch |
| 7,833,401 B2 | 11/2010 | Han et al. |
| 7,838,086 B2 | 11/2010 | Keil et al. |
| 7,867,356 B2 | 1/2011 | Tong et al. |
| 7,922,881 B2 | 4/2011 | Ivanov et al. |
| 7,955,673 B2 | 6/2011 | Takao et al. |
| 9,101,954 B2 | 8/2015 | Wang et al. |
| 9,236,171 B2 | 1/2016 | Ito et al. |
| 9,371,578 B2 | 6/2016 | Tsukamoto |
| 9,536,715 B2 | 1/2017 | Tsukamoto |
| 2001/0007302 A1 | 7/2001 | Hong |
| 2001/0019016 A1 | 9/2001 | Subramani et al. |
| 2001/0050220 A1 | 12/2001 | Chiang et al. |
| 2002/0047116 A1 | 4/2002 | Pavate et al. |
| 2002/0084181 A1 | 7/2002 | Gopalraja et al. |
| 2002/0092763 A1 | 7/2002 | Denning et al. |
| 2003/0000648 A1 | 1/2003 | Park et al. |
| 2003/0188685 A1 | 10/2003 | Wang et al. |
| 2004/0089543 A1 | 5/2004 | Kim |
| 2004/0118521 A1 | 6/2004 | Pancham et al. |
| 2004/0206804 A1 | 10/2004 | Kim et al. |
| 2004/0256217 A1 | 12/2004 | Nulman et al. |
| 2005/0006222 A1 | 1/2005 | Ding et al. |
| 2005/0048876 A1 | 3/2005 | West et al. |
| 2005/0064248 A1 | 3/2005 | O'Donnell et al. |
| 2005/0098427 A1 | 5/2005 | Cho et al. |
| 2005/0236270 A1 | 10/2005 | Cheng et al. |
| 2005/0255691 A1 | 11/2005 | Ding et al. |
| 2005/0271984 A1 | 12/2005 | Brueckner et al. |
| 2005/0284372 A1* | 12/2005 | Murugesh .......... C23C 16/4404 118/715 |
| 2005/0284756 A1 | 12/2005 | Hom et al. |
| 2006/0005767 A1 | 1/2006 | Tsai et al. |
| 2006/0070875 A1 | 4/2006 | Nulman et al. |
| 2006/0105182 A1 | 5/2006 | Brueckner et al. |
| 2006/0124634 A1 | 6/2006 | Mize et al. |
| 2006/0172542 A1 | 8/2006 | Bera et al. |
| 2006/0188742 A1 | 8/2006 | West et al. |
| 2006/0278341 A1 | 12/2006 | Park et al. |
| 2006/0292310 A1 | 12/2006 | Le et al. |
| 2007/0034154 A1 | 2/2007 | Fink |
| 2007/0051472 A1 | 3/2007 | Murakami et al. |
| 2007/0056688 A1 | 3/2007 | Kim et al. |
| 2007/0062452 A1 | 3/2007 | Pancham et al. |
| 2007/0102286 A1 | 5/2007 | Scheible et al. |
| 2007/0125646 A1 | 6/2007 | Young et al. |
| 2007/0151947 A1 | 7/2007 | Song et al. |
| 2007/0166477 A1 | 7/2007 | Chang |
| 2007/0170052 A1 | 7/2007 | Ritchie et al. |
| 2007/0173059 A1 | 7/2007 | Young et al. |
| 2007/0181064 A1 | 8/2007 | Fink |
| 2007/0215279 A1 | 9/2007 | Koshiishi |
| 2007/0224709 A1 | 9/2007 | Ogasawara |

(56) References Cited

U.S. PATENT DOCUMENTS

| | | |
|---|---|---|
| 2007/0240795 A1 | 10/2007 | Sato et al. |
| 2007/0273287 A1 | 11/2007 | Kuwahara et al. |
| 2007/0283884 A1 | 12/2007 | Tiller et al. |
| 2008/0000876 A1 | 1/2008 | Park et al. |
| 2008/0038481 A1 | 2/2008 | West et al. |
| 2008/0066868 A1 | 3/2008 | Masuda |
| 2008/0087382 A1 | 4/2008 | Sugiyama et al. |
| 2008/0110747 A1 | 5/2008 | Ding et al. |
| 2008/0110760 A1 | 5/2008 | Han et al. |
| 2008/0149595 A1 | 6/2008 | Cirigliano |
| 2008/0149598 A1 | 6/2008 | Hayashi et al. |
| 2008/0156264 A1 | 7/2008 | Fair et al. |
| 2008/0178801 A1 | 7/2008 | Pavloff et al. |
| 2008/0196661 A1 | 8/2008 | West |
| 2008/0223725 A1 | 9/2008 | Han et al. |
| 2008/0280066 A1 | 11/2008 | Schade Van Westrum et al. |
| 2008/0289958 A1 | 11/2008 | Kardokus et al. |
| 2008/0318433 A1 | 12/2008 | Dhindsa et al. |
| 2009/0120462 A1 | 5/2009 | West et al. |
| 2009/0194414 A1 | 8/2009 | Nolander et al. |
| 2010/0059366 A1 | 3/2010 | Brueckner et al. |
| 2012/0258280 A1 | 10/2012 | Jackson et al. |
| 2012/0318668 A1 * | 12/2012 | Tsukamoto ......... H01J 37/3447 204/298.02 |
| 2014/0174917 A1 | 6/2014 | Tsukamoto |
| 2015/0079336 A1 | 3/2015 | Wang et al. |
| 2015/0231703 A1 | 8/2015 | Björmander et al. |
| 2015/0348706 A1 | 12/2015 | Sano et al. |
| 2018/0211819 A1 | 7/2018 | Koch |
| 2018/0218890 A1 | 8/2018 | Dunlop et al. |

FOREIGN PATENT DOCUMENTS

| | | |
|---|---|---|
| CN | 1849409 A | 10/2006 |
| CN | 201842885 U | 5/2011 |
| CN | 201842886 U | 5/2011 |
| CN | 101519767 B | 7/2011 |
| CN | 201918355 U | 8/2011 |
| CN | 103184409 A | 7/2013 |
| CN | 103430280 A | 12/2013 |
| CN | 103681201 B | 3/2014 |
| CN | 104044016 A | 9/2014 |
| CN | 105088155 A | 11/2015 |
| EP | 0869543 A2 | 10/1998 |
| JP | S61296925 A | 12/1986 |
| JP | 02133570 A | 5/1990 |
| JP | 10237639 A | 9/1998 |
| JP | 11209873 A | 8/1999 |
| JP | 2006299331 A | 11/2006 |
| JP | 2006307243 A | 11/2006 |
| JP | 2007112641 A | 5/2007 |
| JP | 2007231392 A | 9/2007 |
| JP | 2007258447 A | 10/2007 |
| JP | 2007277659 A | 10/2007 |
| JP | 2007277730 A | 10/2007 |
| JP | 2007297699 A | 11/2007 |
| JP | 2008056990 A | 3/2008 |
| JP | 4473852 B2 | 5/2008 |
| JP | 2008118015 A | 5/2008 |
| JP | 4435835 B2 | 6/2008 |
| JP | 2008188647 A | 8/2008 |
| JP | 2014111841 A | 6/2014 |
| KR | 200396090 Y1 | 9/2005 |
| KR | 1020130018957 A | 2/2013 |
| TW | 200609366 A | 3/2006 |
| WO | 2004/033742 A2 | 4/2004 |
| WO | 2005001918 A1 | 1/2005 |
| WO | 2005/026408 A2 | 3/2005 |
| WO | 2005077677 A1 | 8/2005 |
| WO | 2017015191 A1 | 1/2017 |
| WO | 2018136368 A1 | 7/2018 |

OTHER PUBLICATIONS

International Search Report and Written Opinion issued in PCT/US2016/042740, dated Oct. 20, 2016, 13 pages.
Second Written Opinion issued in PCT/US2016/042740, dated Jul. 27, 2017, 7 pages.
International Search Report and Written Opinion issued in PCT/US2018/055380, dated Feb. 11, 2019, 13 pages.
Interntional Search Report and Written Opinion issued in PCT/US2018/013747, dated Apr. 25, 2018, 12 pages.
Supplemental European Search Report issued in EP Application 16828351.3, dated Jan. 29, 2019, 10 pages.
International Preliminary Report on Patentability received for PCT Patent Application No. PCT/US2018/013747, dated Aug. 1, 2019, 11 pages.

* cited by examiner

MULTI-PATTERNED SPUTTER TRAPS AND METHODS OF MAKING

CROSS-REFERENCE TO RELATED APPLICATION

This application claims priority to Provisional Application No. 62/570,842, filed Oct. 11, 2017, which is herein incorporated by reference in its entirety.

TECHNICAL FIELD

The present disclosure relates to sputter traps and coil sets used in physical vapor deposition apparatuses. More particularly, the present disclosure relates to sputter traps with reduced particles and methods of making the same.

BACKGROUND

Deposition methods are used in forming films of material across substrate surfaces. Deposition methods can be used, for example, in semiconductor device fabrication processes to form layers ultimately used in making integrated circuits and devices. One example of a deposition method is physical vapor deposition (PVD). PVD methodologies may include sputtering processes. Sputtering includes forming a target of a material which is to be deposited, and providing the target as a negatively charged cathode proximate to a strong electric field. The electric field is used to ionize a low pressure inert gas and form plasma. Positively charged ions in the plasma are accelerated by the electric field toward the negatively charged sputtering target. The ions impact the sputtering target, and thereby eject target material. The ejected target material is primarily in the form of atoms or groups of atoms, and can be used to deposit thin, uniform films on substrates placed in the vicinity of the target during the sputtering process.

It is desirable to develop components for use with a deposition apparatus, a sputtering chamber system, and/or ionized plasma deposition system without causing shorts, plasma arcing, interruptions to the deposition process, or particle generation. Improvements in components for use in deposition apparatus are desired.

SUMMARY

These and other needs are addressed by the various aspects, embodiments, and configurations of the present disclosure.

Embodiments of the present disclosure include a sputtering chamber component comprising a particle trap, the particle trap comprising: a first pattern formed on at least a portion of a surface of the particle trap, the first pattern arranged in a repeating pattern having a first pattern thread count, the first pattern having a first pattern top surface and, a second pattern formed on at least a portion of the first pattern top surface, the second pattern arranged in a repeating pattern having a second thread count, the second pattern having a second pattern top surface. The first pattern comprises one of: first indentations having a first depth and separated by first and second threads, the first and second threads having first and second thread top surfaces that form the first pattern top surface, and first ridges having a first height and separated by first and second grooves, the first ridges having first ridge top surfaces that form the first pattern top surface. The second pattern comprises one of: second indentations having a second depth and separated by third and fourth threads, the third and fourth threads having third and fourth thread top surfaces configured to form the second pattern top surface and second ridges having a second height and separated by third and fourth grooves, the second ridges having second ridge top surfaces configured to form the second pattern top surface.

The sputtering chamber particle trap according to paragraph [0006], wherein the first pattern thread count is about 15 threads per inch to about 80 threads and the second pattern thread count is about 15 threads per inch to about 80 threads.

The sputtering chamber particle trap according to either paragraph [0006] or [0007], further comprising a third pattern formed on at least a portion of the first and second patterns.

The sputtering chamber particle trap according to any of paragraphs [0006]-[0008], further comprising at least one additional pattern formed on at least a portion of the third pattern.

The sputtering chamber particle trap according to any of paragraphs [0006]-[0009], the first pattern comprising the first indentations having a first depth and separated by first and second threads and the second pattern comprising the second indentations having a second depth and separated by third and fourth threads, wherein: the first threads extending in a first direction form side walls separating adjacent first indentations in a second direction, the second direction at an angle of greater than 0 and less than 180 degrees to the first direction, and the second threads extending in the second direction form side walls separating adjacent first indentations in the first direction; and, the third threads extending in a direction parallel to the first direction form side walls separating adjacent second indentations in a direction parallel to the second direction, and the fourth threads extending in the direction parallel to the second direction form side walls separating adjacent second indentations in the direction parallel to the first direction.

The sputtering chamber particle trap according to any of paragraphs [0006]-[0008], the first pattern comprising the first indentations having a first depth and separated by first and second threads and the second pattern comprising the second ridges having a second height and separated by third and fourth grooves, wherein: the first threads extending in a first direction form side walls separating adjacent first indentations in a second direction, the second direction at an angle of greater than 0 and less than 180 degrees to the first direction, and the second threads extending in the second direction form side walls separating adjacent first indentations in the first direction; and, the third grooves extending in a direction parallel to the first direction form side walls separating adjacent second ridges in a direction parallel to the second direction, and the fourth grooves extending in the direction parallel to the second direction form side walls separating adjacent second ridges in the direction parallel to the first direction.

The sputtering chamber particle trap according to any of paragraphs [0006]-[0008], the first pattern comprising the first ridges having a first height and separated by first and second grooves and the second pattern comprising the second ridges having a second height and separated by third and fourth grooves, wherein: the first grooves extending in a first direction form side walls separating adjacent first ridges in a second direction, the second direction at an angle of greater than 0 and less than 180 degrees to the first direction, and the second grooves extending in the second direction form side walls separating adjacent first ridges in the first direction; and, the third grooves extending in a direction parallel to the first direction form side walls separating adjacent second ridges in a direction parallel to the second direction, and the fourth grooves extending in the direction parallel to the second direction form side walls separating adjacent second ridges in the direction parallel to the first direction.

The sputtering chamber particle trap according to any of paragraphs [0006]-[0008], the first pattern comprising the first ridges having a first height and separated by first and second grooves and the second pattern comprising the second indentations having a second depth and separated by third and fourth threads, wherein: the first grooves extending in a first direction form side walls separating adjacent first ridges in a second direction, the second direction at an angle of greater than 0 and less than 180 degrees to the first direction, and the second grooves extending in the second direction form side walls separating adjacent first ridges in the first direction; and, the third threads extending in a direction parallel to the first direction form side walls separating adjacent second indentations in a direction parallel to the second direction, and the fourth threads extending in the direction parallel to the second direction form side walls separating adjacent second indentations in the direction parallel to the first direction.

The sputtering chamber particle trap according to any of paragraphs [0006]-[0013], wherein the first pattern thread count is greater than the second pattern thread count.

The sputtering chamber particle trap to any of paragraphs [0006]-[0013], wherein the second pattern thread count is greater than the first pattern thread count.

The sputtering chamber particle trap to any of paragraphs [0006]-[0013], wherein the first pattern thread count is the same as the second pattern thread count.

The sputtering chamber particle trap to any of paragraphs [0006]-[0016], wherein at least one of the first and second indentations have a parallelogram cross-sectional shape in a direction parallel to the surface.

The sputtering chamber particle trap to any of paragraphs [0006]-[0017], wherein at least one of the first and second ridges have a parallelogram cross-sectional shape in a direction parallel to the surface.

The sputtering chamber particle trap to any of paragraphs [0006]-[0018], wherein an average depth of at least one of the first and second indentations is from about 330 μm to about 600 μm.

The sputtering chamber particle trap to any of paragraphs [0006]-[0019], wherein an average height of at least one of the first and second ridges is from about 0 μm to about 600 μm.

The sputtering chamber particle trap to any of paragraphs [0006]-[0020], wherein the sputtering chamber particle trap is formed from at least one material chosen from tantalum (Ta), titanium (Ti), aluminum (Al), copper (Cu), nickel (Ni), cobalt (Co), molybdenum (Mo), gold (Au), silver (Ag), platinum (Pt), tungsten (W), chromium (Cr), a tantalum (Ta) alloy, a titanium (Ti) alloy, an aluminum (Al) alloy, a copper (Cu) alloy, a nickel (Ni) alloy, a cobalt (Co) alloy, a molybdenum (Mo) alloy, a gold (Au) alloy, a silver (Ag) alloy, a platinum (Pt) alloy, a tungsten (W) alloy, and a chromium (Cr) alloy.

Embodiments of the present disclosure also include a method of forming a particle trap on a sputtering chamber component, the method comprising: forming a first pattern on at least a portion of a surface of the sputtering chamber component to form a first patterned top surface; and, forming a second pattern on at least a portion of the first patterned top surface. The first pattern comprises one of: a plurality of first indentations arranged in a repeating pattern with adjacent first indentations separated by side walls, the first indentations having a first depth and a first width; and, a plurality of first ridges arranged in a repeating pattern with adjacent first ridges separated by grooves, the first ridges having a first height and a first width. The second pattern comprises one of: a plurality of second indentations arranged in a repeating pattern with adjacent second indentations separated by side walls, the second indentations having a second depth and a second width; and, a plurality of second ridges arranged in a repeating pattern with adjacent second ridges separated by grooves, the second ridges having a second height and a second width.

The method according to paragraph [0022], wherein at least one of the first and second indentations are shaped as inverted pyramids with the base of each inverted pyramid parallel to the surface and the apex of each inverted pyramid oriented into the surface and wherein the height of each inverted pyramid defines the depth of each indentation of the plurality of at least one of the first and second indentations.

The method according to either paragraph [0022] or [0023], wherein forming the first pattern does not include grit blasting or wire brushing, and wherein forming the second pattern does not include grit blasting or wire brushing.

The method according to any of paragraphs [0022]-[0024], wherein an average depth of at least one of the first and second indentations is from about 330 μm to about 600 μm.

The method according to any of paragraphs [0022]-[0025], wherein an average height of at least one of the first and second ridges is from about 0 μm to about 600 μm.

The method according to any of paragraphs [0022]-[0026], wherein the first pattern is formed by pressing a first knurling tool into the sputtering chamber component and the second pattern is formed by pressing a second knurling tool into the sputtering chamber component, wherein the first knurling tool and the second knurling tool have thread counts that are the same or different.

The method according to any of paragraphs [0022]-[0027], wherein the first pattern has a first thread count and the second pattern has a second thread count, wherein the first thread count and the second thread count are the same or different.

The method according to any of paragraphs [0022]-[0028], wherein the first thread count is about 15 threads per inch to about 80 threads per inch and the second thread count is about 15 threads per inch to about 80 threads per inch.

The method according to any of paragraphs [0022]-[0029], wherein one of the first thread count and the second thread count is about 25 threads per inch, and wherein the other of the first thread count and the second thread count is about 80 threads per inch.

The method according to any of paragraphs [0022]-[0030], wherein the sputtering chamber particle trap is formed from at least one material chosen from tantalum (Ta), titanium (Ti), aluminum (Al), copper (Cu), nickel (Ni), cobalt (Co), molybdenum (Mo), gold (Au), silver (Ag), platinum (Pt), tungsten (W), chromium (Cr), a tantalum (Ta) alloy, a titanium (Ti) alloy, an aluminum (Al) alloy, a copper (Cu) alloy, a nickel (Ni) alloy, a cobalt (Co) alloy, a molybdenum (Mo) alloy, a gold (Au) alloy, a silver (Ag) alloy, a platinum (Pt) alloy, a tungsten (W) alloy, and a chromium (Cr) alloy.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

Figure 1:
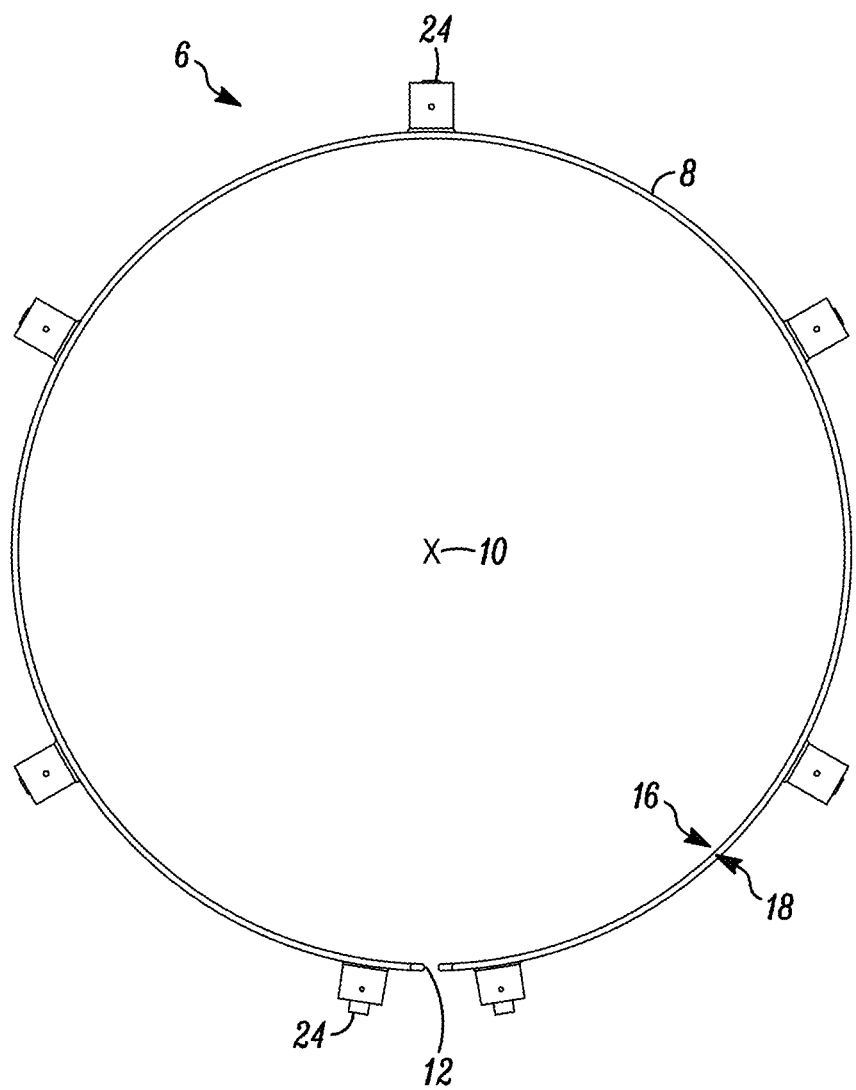
FIG. 1 is a top view of an exemplary coil that may be used in a sputtering apparatus.

During a sputtering process, sputtered particles are ejected into the gas phase and may deposit on surfaces in the sputtering chamber. Over time, these deposits build up and may become dislodged during a sputtering process, forming particulates. The particulates may then redeposit on the substrate, leading to contamination of the substrate. A particle trap captures particles and prevents particulates from redepositing on the substrate during sputtering. To improve the useful life of components used within the sputtering chamber, sputtering chamber components can be modified to function as sputtered material re-adhesion sites and particle traps. A material adhesion site or particle trap may include a specifically patterned surface that reduces particle flaking by, for example, increasing surface area and mechanical keying to the surface.

Disclosed herein is a particle trap that may be used in a physical vapor deposition apparatus. The particle trap may be used to prevent, for example through capture, contaminating particles from redepositing on a substrate within the physical deposition apparatus. Various sputtering chamber components may comprise a particle trap as disclosed herein. Example sputtering chamber components suitable for a particle trap include bosses, coils, targets, and other components used within a sputtering chamber. For example the surface patterns of the particle trap can be applied to the entire surface or a portion of a surface of a coil, target (i.e., sidewalls, flange, backing plate), shields, bosses, cover rings, cups, pins and/or clamps, and other surfaces within the sputtering chamber that are exposed to sputtering plasma. Also disclosed herein is a coil having a particle trap for use in a physical vapor deposition apparatus. Also disclosed herein is a method of forming a particle trap on a coil for use in a physical vapor deposition apparatus. In some embodiments, the particle trap may include either (i) a surface that has indentations, depressions, or dimpled pockets or (ii) a surface that has ridges or raised pyramids according to a first pattern formed into the surface. In addition, the particle trap may include either (i) a surface that has indentations, depressions, or dimpled pockets or (ii) a surface that has ridges or raised pyramids according to a second pattern formed into the same surface. In addition, the particle trap may further include a third, fourth, fifth, or more pattern formed into the same surface. The indentations and/or ridges according to at least two distinct patterns may be separately formed, in any order, in a dual patterned arrangement with both patterns embedded into or otherwise associated with a common surface. It is believed that this at least dual patterned arrangement creates depth (i.e. via indentations) for trapping redeposited sputter particles, while also providing finer texture (i.e. via grooves and ridges) for suppressing arcing. It is believed that this at least dual patterned arrangement creates an increase in surface area while breaking up straight lines to reduce surface tension.

In some embodiments, the particle trap may be formed along the surface of a coil that may be used in a physical vapor deposition apparatus. In some embodiments, a sputtering coil may have first and second patterns coincident on at least a portion of a surface of the particle trap. Advantageously, the surface having at least two different patterns does not require further surface texturing, or in other words, does not include any one of a chemical etched, plasma etched, grit blasted, particle blasted, or wire brushed pattern. The surface, including at least two distinct patterns, can be applied to coils, targets, shielding, bosses, and any surfaces within the sputtering chamber that are exposed to sputtering plasma and could thus contribute to particulate generation. The at least two distinct patterns are at least distinguishable under magnification.

Figure 2:
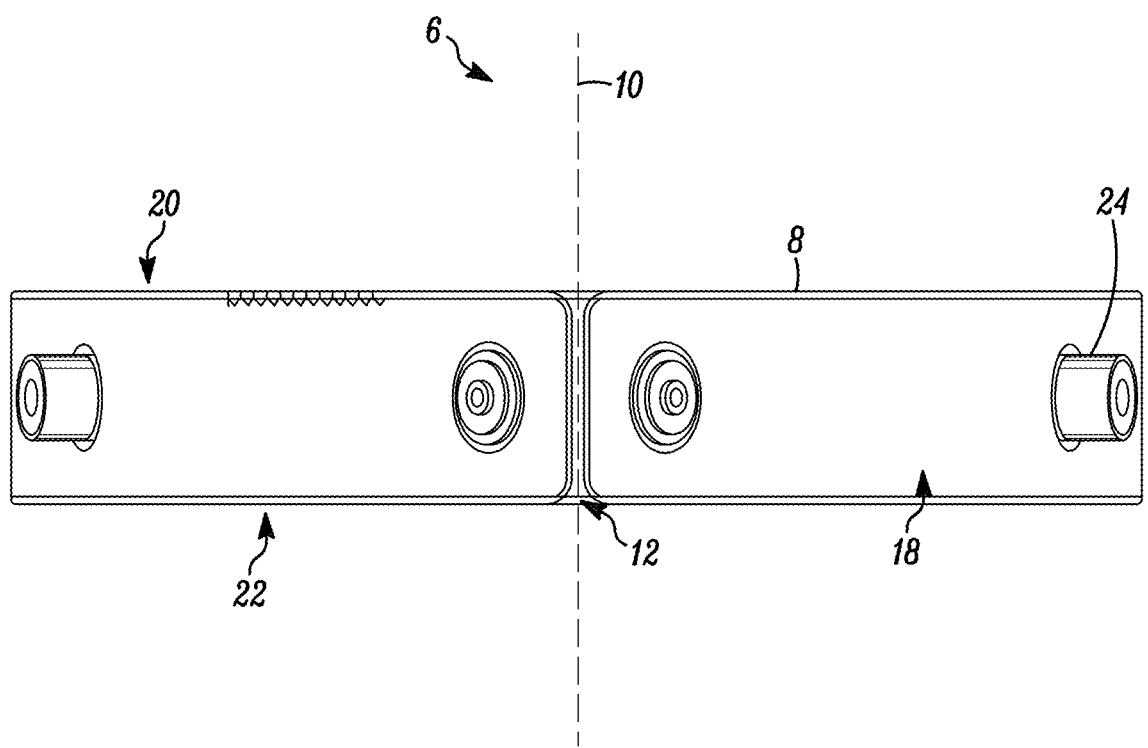
FIG. 2 is a side view of an exemplary coil that may be used in a sputtering apparatus.

FIG. 1 is a top view of a sputtering coil 6 that may be used in a physical vapor deposition apparatus such as a sputtering chamber. FIG. 2 illustrates the sputtering coil 6 of FIG. 1 as viewed from the side. As shown in FIGS. 1 and 2, the sputtering coil 6 may include a ring 8 that may be substantially circular. The ring 8 has a central axis 10 and a circumference of the ring is defined around the central axis 10. In some embodiments, the sputtering coil 6 may be formed as a ring 8 with a gap 12 in the circumference. For example, the ring 8 may have a first end and a second end which are spaced apart by the gap 12. The sputtering coil 6 may have an inside surface 16 facing radially inward toward the central axis 10 of the ring 8. The sputtering coil 6 may have an outer surface 18 facing radially away from the central axis 10 of the ring 8.

As shown from the side view of FIG. 2, the sputtering coil 6 has a top surface 20 that lies in a plane perpendicular to the central axis 10 of the ring 8. In some embodiments, during a sputtering operation, the top surface 20 may face in the direction of a sputtering target. The sputtering coil 6 also includes a bottom surface 22 that lies in a plane perpendicular to the central axis 10 of the ring 8 and opposite the top surface 20. During a sputtering operation, the bottom surface 22 may be oriented to face in the direction of the substrate or away from the sputtering target. In some embodiments, the sputtering coil 6 may include additional components or features, such one or more bosses 24 attached to the sputtering coil 6 and extending from the outer surface 18. The bosses 24 may be used to hold the sputtering coil 6 in place in a sputtering apparatus. In some embodiments, at least a portion of a surface of the sputtering coil 6 exposed to the sputtering chamber environment can have a particle trap formed on it. The particle trap can also be formed on at least one of the bosses 24. For example, a particle trap may be formed on the complete surface or on at least a portion of a surface exposed to the sputtering chamber of at least one of the bosses 24. In some embodiments, particle traps are formed on the sputtering coil 6 and the bosses 24.

Figure 3:
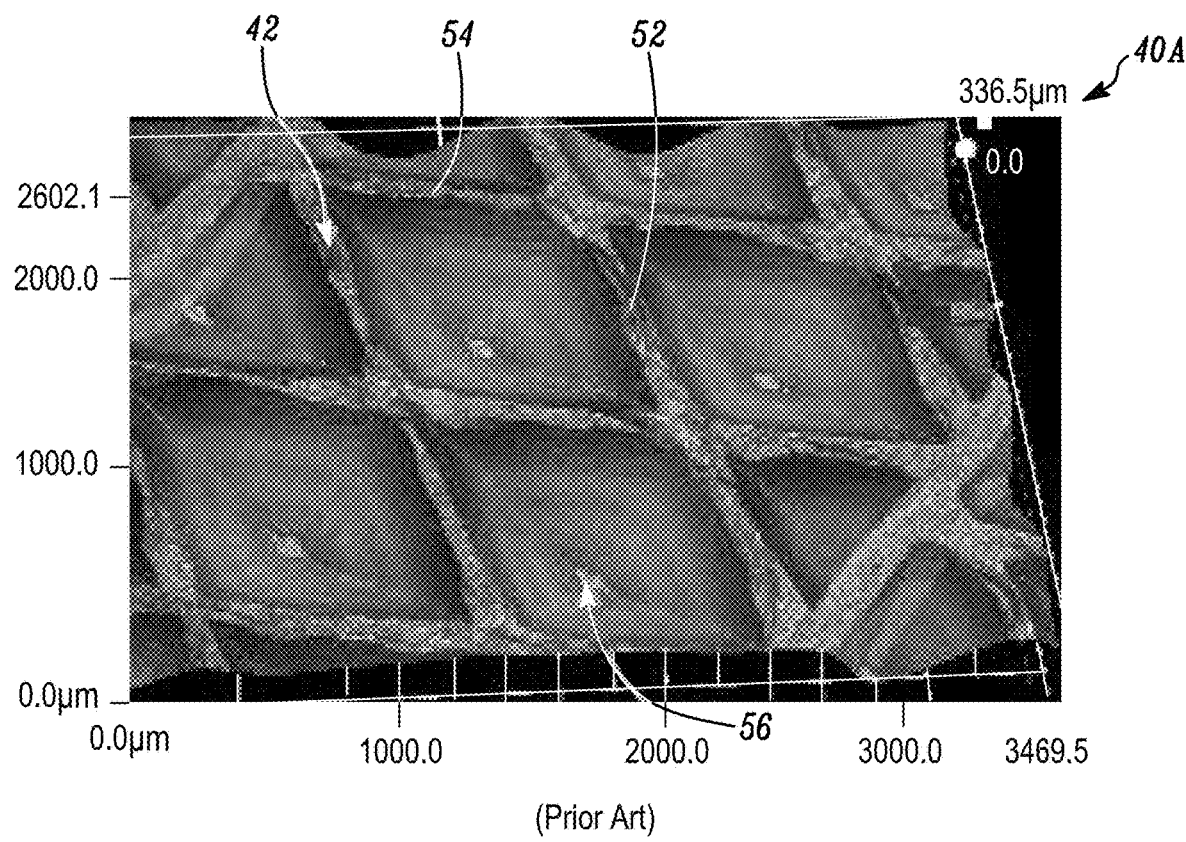
FIG. 3 is a micrograph of a comparative example of a knurling pattern that may be used on a particle trap.
Figure 4:
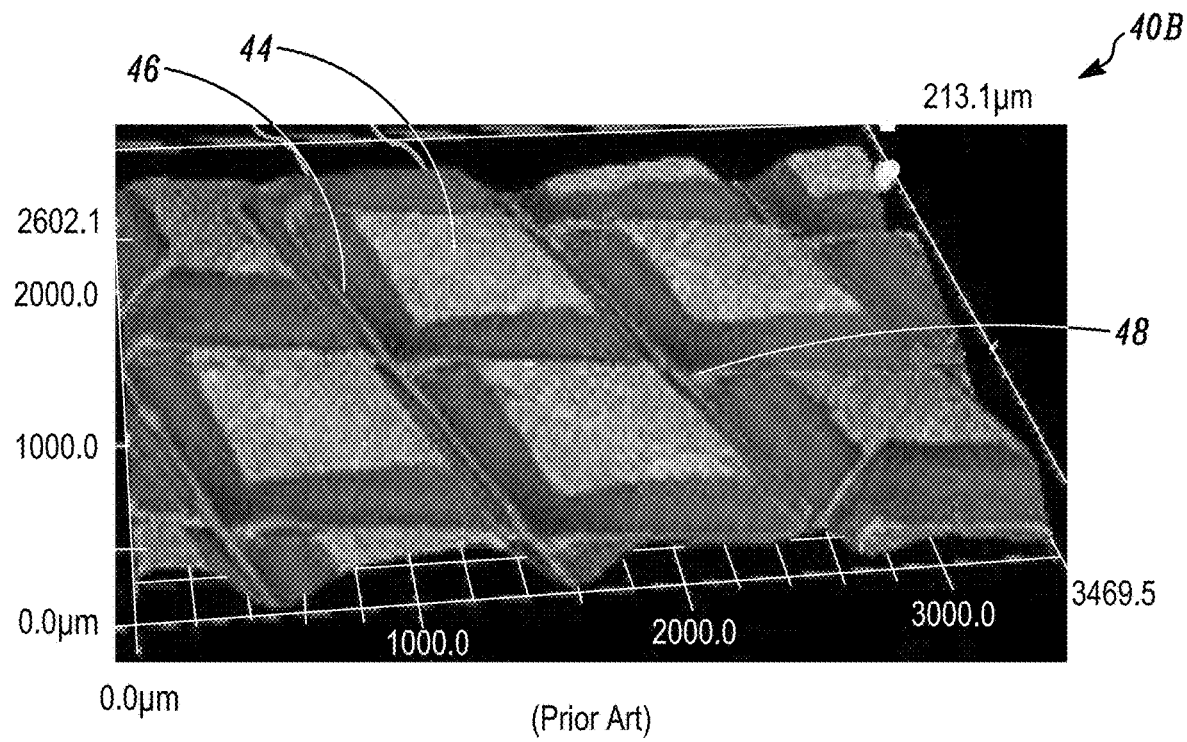
FIG. 4 is a micrograph of another comparative example of a knurling pattern that may be used on a particle trap.

FIG. 3 shows a comparative example of a particle trap 40A formed on a surface of a sputtering chamber component. As shown in FIG. 3, the particle trap 40A includes a texture 42 formed on the surface of the sputtering chamber component. The texture 42 is a particular knurl referred to herein as an inverted knurl or a female knurl. Indentations 56 are defined between the first and second threads 52, 54 in a repeating adjacent pattern. FIG. 4 shows another comparative example of a particle trap 40B having a knurled patterned referred to as a standard knurl or male knurl. Projections 44 are defined between first and second depressed threads or grooves 46, 48.

Figure 5:
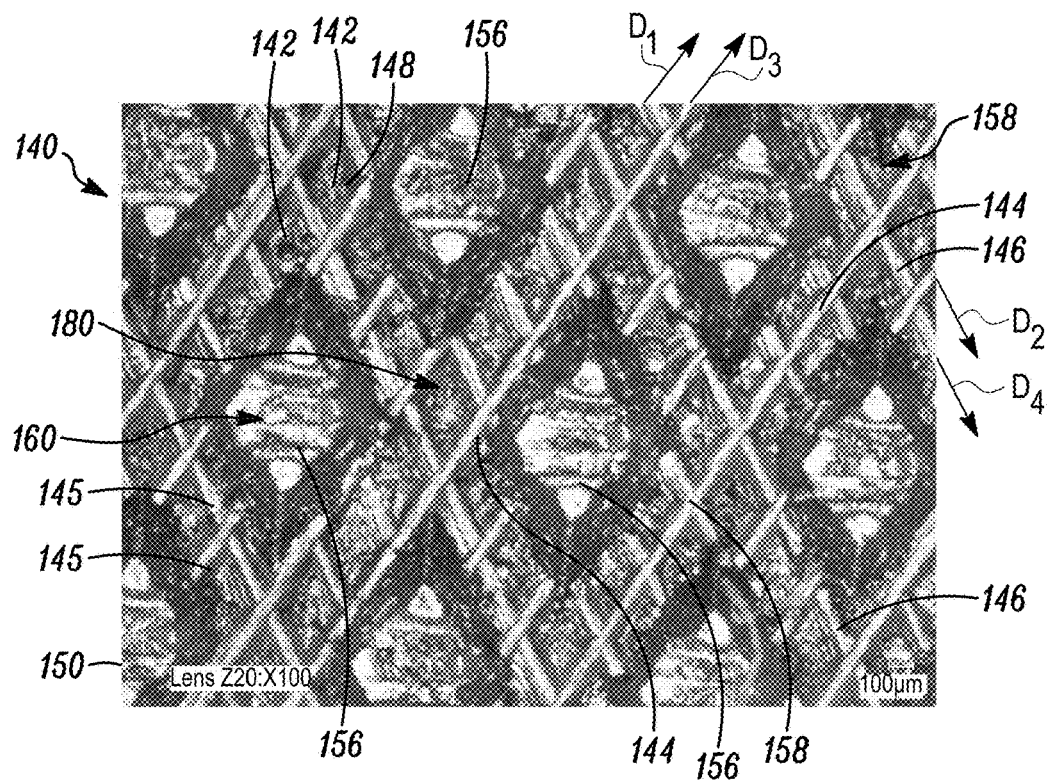
FIG. 5 is a micrograph showing an example of first and second knurling patterns that may be used on a particle trap, according to some embodiments.

FIG. 5 is an image of a particle trap 140 according to the present disclosure. Particle trap 140 includes a first pattern 160 and a second pattern 180 on a surface 150. The first pattern 160 and the second pattern 180 are coincident over the entire surface 150. In some embodiments, the first pattern 160 and the second pattern 180 are coincident or are both present on a portion of the surface. In some embodiments, surface 150 may be on an inner surface 16 and/or outer surface 18 of a coil 6 as shown in FIG. 1. In some embodiments, surface 150 may be a portion of or the entire inner surface 16 and/or outer surface 18 of a coil 6 as shown in FIG. 1. FIG. 5 will be discussed in further detail below. While coils are shown in the particle trap embodiments herein, the particle trap including at least first and second patterns as described herein can be completely or partially formed or knurled onto portions of or entire surfaces of bosses, for example, the outer radial surfaces of bosses 24 as shown in FIG. 1. More generally, the particles trap including at least first and second patterns as described herein can be completely or partially formed or knurled onto portions of or entire surfaces of sputtering components exposed to physical vapor deposition conditions.

Figure 6:
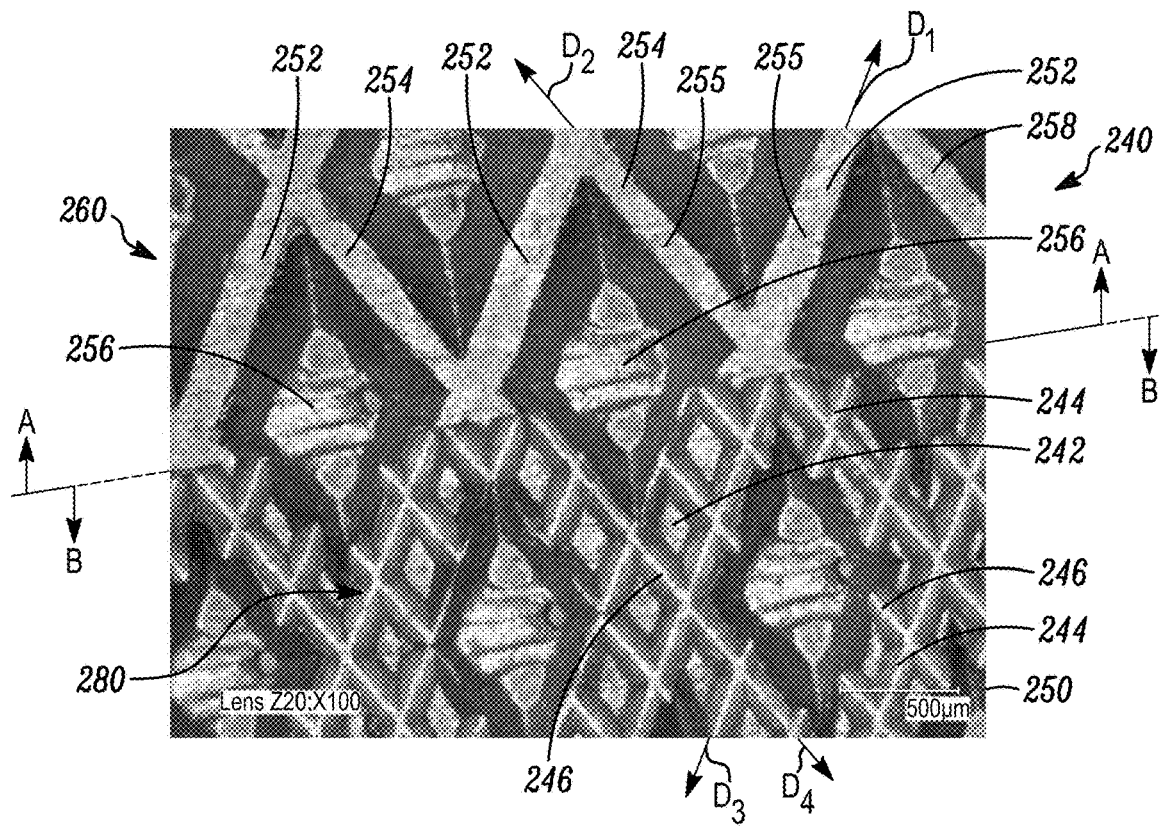
FIG. 6 is a micrograph showing an example of a first knurling pattern on portion A, and the first knurling pattern and a second knurling pattern on portion B, that may be used on a particle trap, according to some embodiments.

FIG. 6 is an image illustrating a particle trap 240 after formation of a first pattern 260 as in portion A (upper region of micrograph) of surface 250 but before the formation of the second pattern 280. FIG. 6 also illustrates a particle trap after formation of a first pattern 260 and a second pattern 280 as in portion B (lower region of micrograph) of surface 250. The first pattern 260 is formed on at least a portion of a surface 250 of the particle trap 240. Pattern 260 is an example of a coarse female knurl including indentations 256, the indentations 256 each having a depth and arranged in a repeating pattern. Indentations 256 are separated in a first direction $D_1$ by threads 254 and in a second direction $D_2$ by threads 252. Second pattern 280 is an example of a fine standard knurl and is patterned into the surface having first pattern 260. Pattern 260 includes ridges 242 having a height and arranged in a repeating pattern. Ridges 242 are separated in a third direction $D_3$ by grooves 246 and in a fourth direction $D_4$ by grooves 244.

Referring again to FIG. 6, threads 252 are parallel to one another and extend in a first direction $D_1$. The first threads 252 form side walls 255 separating adjacent indentations 256 in a second direction $D_2$. Threads 254 are parallel to one another and extend in the second direction $D_2$. The second threads 254 form side walls 255 separating adjacent indentations 256 in the first direction $D_1$. The second direction is an angle of greater than 0 and less than 180 degrees to the first direction and the first threads 252 intersect the second threads 254. The top surfaces of threads 252 and 254 form a top surface 258. Top surface 258 of pattern 260 of top portion A of FIG. 6 is shown schematically in cross-section in FIG. 9.

Referring again to FIG. 5 illustrating features of a second pattern, the particle trap 140 further includes a second pattern 180 which is coincident on at least a portion of the surface with the first pattern 160. For example, in some embodiments, the second pattern is formed on at least a portion of the top surface 158 (similarly as for top surface 258 in FIG. 6). The second pattern of FIG. 5 is a male knurl and includes ridges 142 having a height $h_1$ and arranged in a repeating pattern. Height $h_1$ of ridges 142 is the distance as measured from top surface 158 to top 148 of ridge 142. In some embodiments, the top 148 of ridges 142 may be flat or substantially flat such that ridges 142 are plateaus, in other words height $h_1$ is equal to zero. In other embodiments, height $h_1$ is greater than zero. Referring again to FIG. 5, the second pattern 180 includes first grooves 144, which are parallel to one another and extend in a third direction $D_3$. The first grooves form sidewalls 145 separating adjacent ridges 142 in a fourth direction $D_4$. The second grooves 146 are parallel to one another and extend in the fourth direction. The second grooves form sidewalls 145 separating adjacent ridges 146 in the third direction. The fourth direction is at an angle of greater than 0 and less than 180 degrees to the third direction, and the first grooves 144 intersect the second grooves 146. In the examples of FIGS. 5 and 6, the indentations and ridges are parallelogram in shape, the directions $D_1$ and $D_3$ are parallel, and the directions $D_2$ and $D_4$ are parallel. The repeated arrangement of parallelograms of distinct first and second patterns is recognizable, if not by the naked eye alone, under magnification. The distinct first and second patterns are aligned wherein directions $D_1$ and $D_3$ are parallel and the directions $D_2$ and $D_4$ are parallel.

Figure 9:
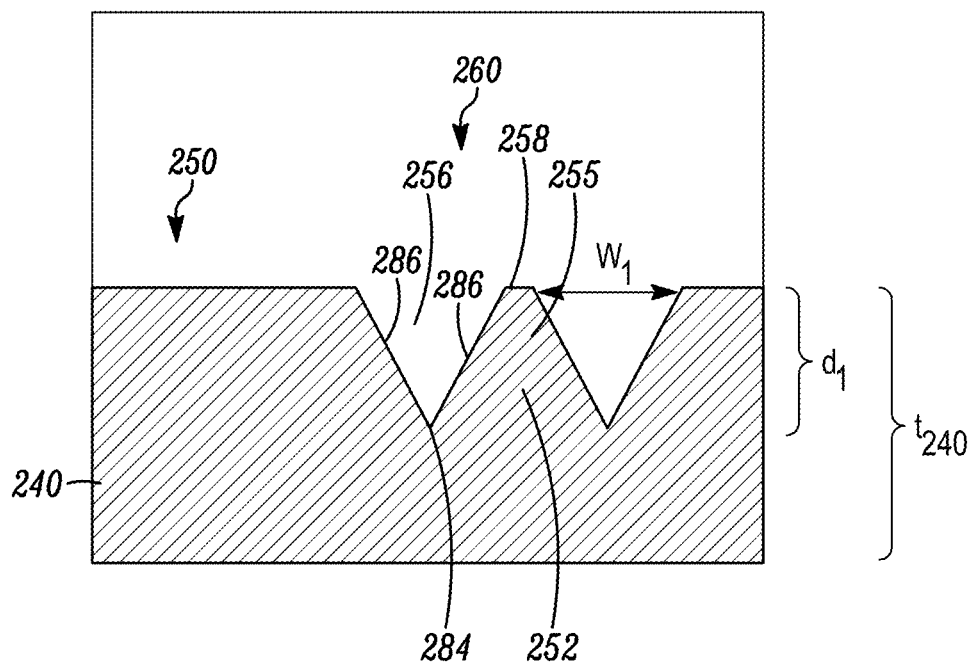
FIG. 9 is a cross-sectional schematic view of a first pattern as shown in portion A as in FIG. 6.

As in FIG. 5, patterns 160 and 180 each include thread counts, which may be the same or different. Thread counts are generally referred to in units of threads per inch (TPI). In some embodiments, the thread count of pattern 160 is greater than the thread count of pattern 180. In other embodiments, the thread count of pattern 160 is less than the thread count of pattern 180. Patterns 160 and 180 are coincident, meaning patterns 160 and 180 at least partially cover the same surface. Features of the patterns may be offset from one another. In other words, in some embodiments, the indentations 156 of pattern 160 do not coincide with the ridges 142 of pattern 180. In other embodiments, features of the patterns 160 and 180 coincide; for example a groove of ridge 142 is coincident with a sidewall of indentation 156 (as shown in FIG. 9). In some embodiments, the first direction separating indentations 156 is parallel to the third direction separating ridges 142. In some embodiments, the second direction separating indentations 156 is parallel to the fourth direction separating ridges 142. In some embodiments, first and third directions are the same, and second and fourth directions are the same, and further the second and fourth directions are at an angle of greater than 0 and less than 180 degrees relative to the first and third directions. The thread count as referred to herein for first pattern 160 is the same as calculated for first threads in a first direction as for second threads in a second direction. The thread count as referred to herein for second pattern 180 is the same as calculated for first grooves in a third direction as for second grooves in a fourth direction. In some embodiments, the first pattern thread count is about 15 threads per inch to about 80 threads and the second pattern thread count is about 15 threads per inch to about 80 threads. A thread count of about 15 threads per inch is relatively coarse, wherein a thread count of about 80 threads per inch is relatively fine. In some embodiments, one of the first pattern and the second pattern has a thread count of about 25 threads per inch, and wherein the other of the first pattern and the second pattern has a thread count of about 80 threads per inch.

Figure 7:
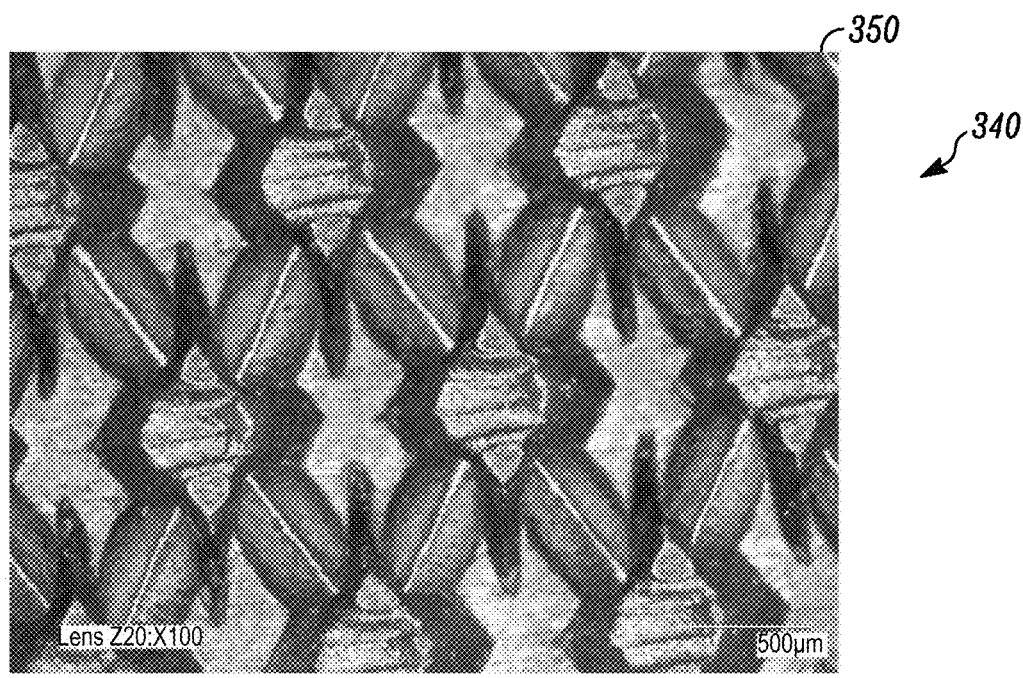
FIG. 7 is a micrograph showing another example of first and second knurling patterns that may be used on a particle trap, according to some embodiments.

FIG. 7 is an image particle trap surface 350 illustrating an alternative dual patterned arrangement of the present disclosure. FIG. 7 illustrates an inverted knurl pattern as a first pattern and a standard knurl as a second pattern on surface 350 of a particle trap 340 according to an embodiment of the present disclosure. In the example of FIG. 7, both first and second patterns are relatively coarse. In some embodiments of the present disclosure, one of the first pattern and the second pattern has a coarse thread count, and wherein the other of the first pattern and the second pattern has a fine thread count. In other embodiments, both the first pattern and the second pattern have a coarse thread count. In yet other embodiments, both the first pattern and the second pattern have a fine thread count. In some embodiments, the thread counts of the first and second patterns are the same.

Figure 8:
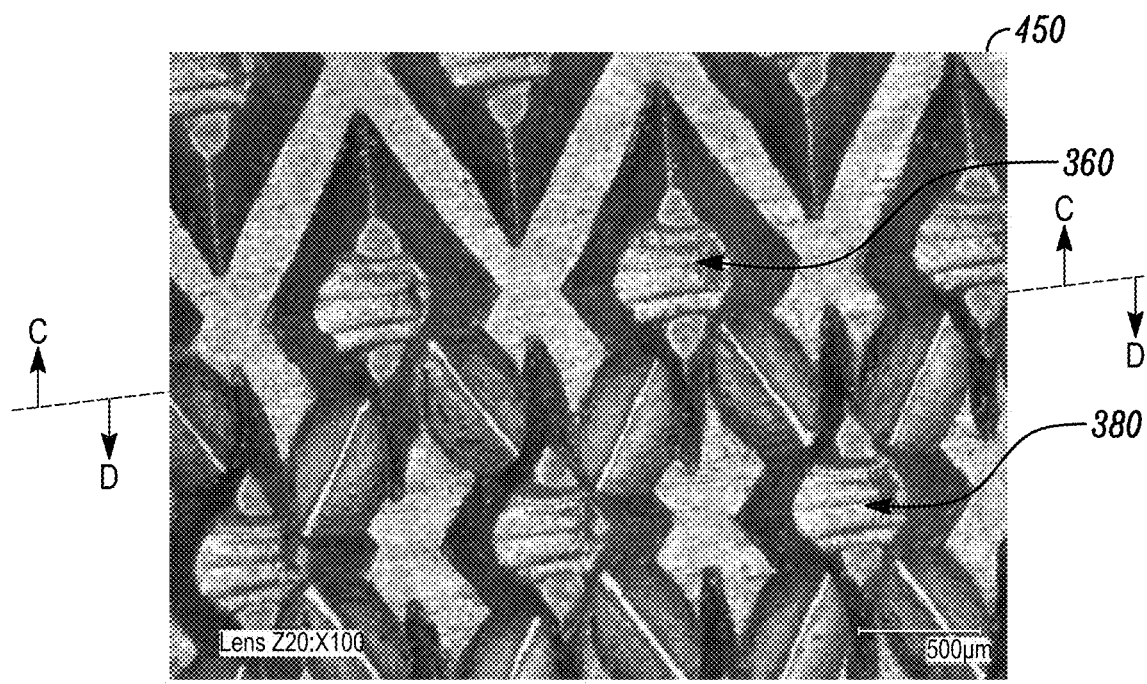
FIG. 8 is a micrograph showing an example of a first knurling pattern on portion C, and the first pattern and a second knurling pattern on portion D (and as shown in FIG. 7), that may be used on a particle trap, according to some embodiments.

FIG. 8 is an image illustrating a particle trap 340 after formation of a first pattern 360 as in portion C (upper region of micrograph) of surface 450 but before the formation of the second pattern 380. FIG. 8 also illustrates a particle trap after formation of a first pattern 360 and a second pattern 380 as in portion D (lower region of micrograph) of surface 450. The example of FIG. 8 shows first and second patterns having same or similar thread count with the ridges of pattern 380 being coincident with the indentations of pattern 360.

FIG. 9 is a cross-sectional schematic view of the first pattern 260 on sputtering chamber component 240 of portion A of FIG. 6. The sputtering chamber component 240 has thickness $t_{240}$. The first pattern 260 includes indentations 256 disposed in a repeated arrangement and threads 252. Each indentation 256 includes bottom 284 and walls 286 (which are formed by threads) and has a depth $d_1$. Top surface 258 is a distance or depth $d_1$ from bottom 284.

Figure 10:
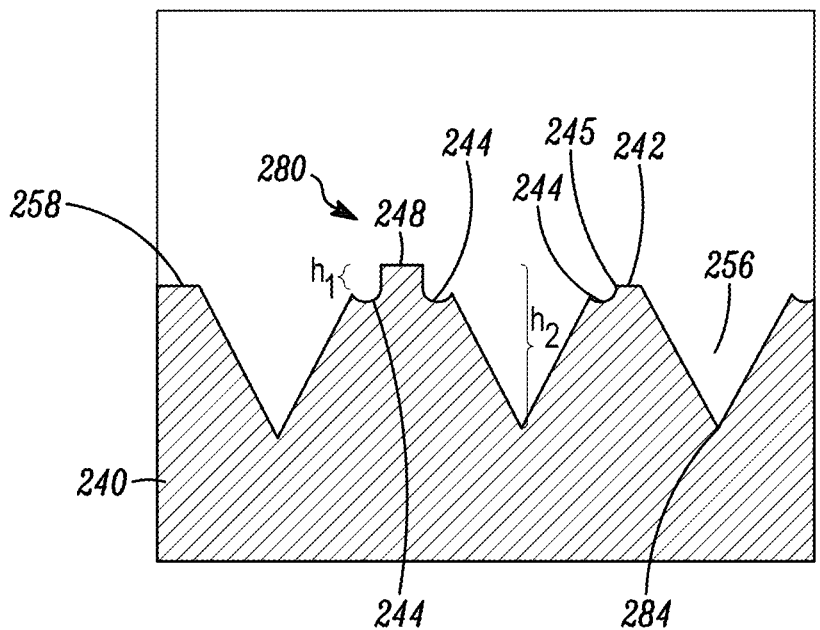
FIG. 10 is a cross-sectional schematic view of a first pattern and a second pattern as shown in portion B as in FIG. 6.

FIG. 10 is a cross-sectional schematic view of the first pattern 260 and second pattern 280 coincident on the sputtering chamber component 240 as in example portion B of FIG. 6. The second pattern 280 on top surface 258 of sputtering chamber component 240 includes ridges 242 disposed in a repeated arrangement, grooves 244, and grooves 246 (grooves 246 are not in the cross-sectional plane as shown in FIG. 10). Each ridge 242 has a height $h_1$ and side walls 245 that formed by grooves 244. Height $h_1$ as shown in FIG. 10 is the distance from top 248 of ridge 242 extending above the top surface 258. Height $h_2$ as shown in FIG. 10 is the distance from top 248 of ridge 242 to the bottom 284 of indentation 256.

Figure 11:
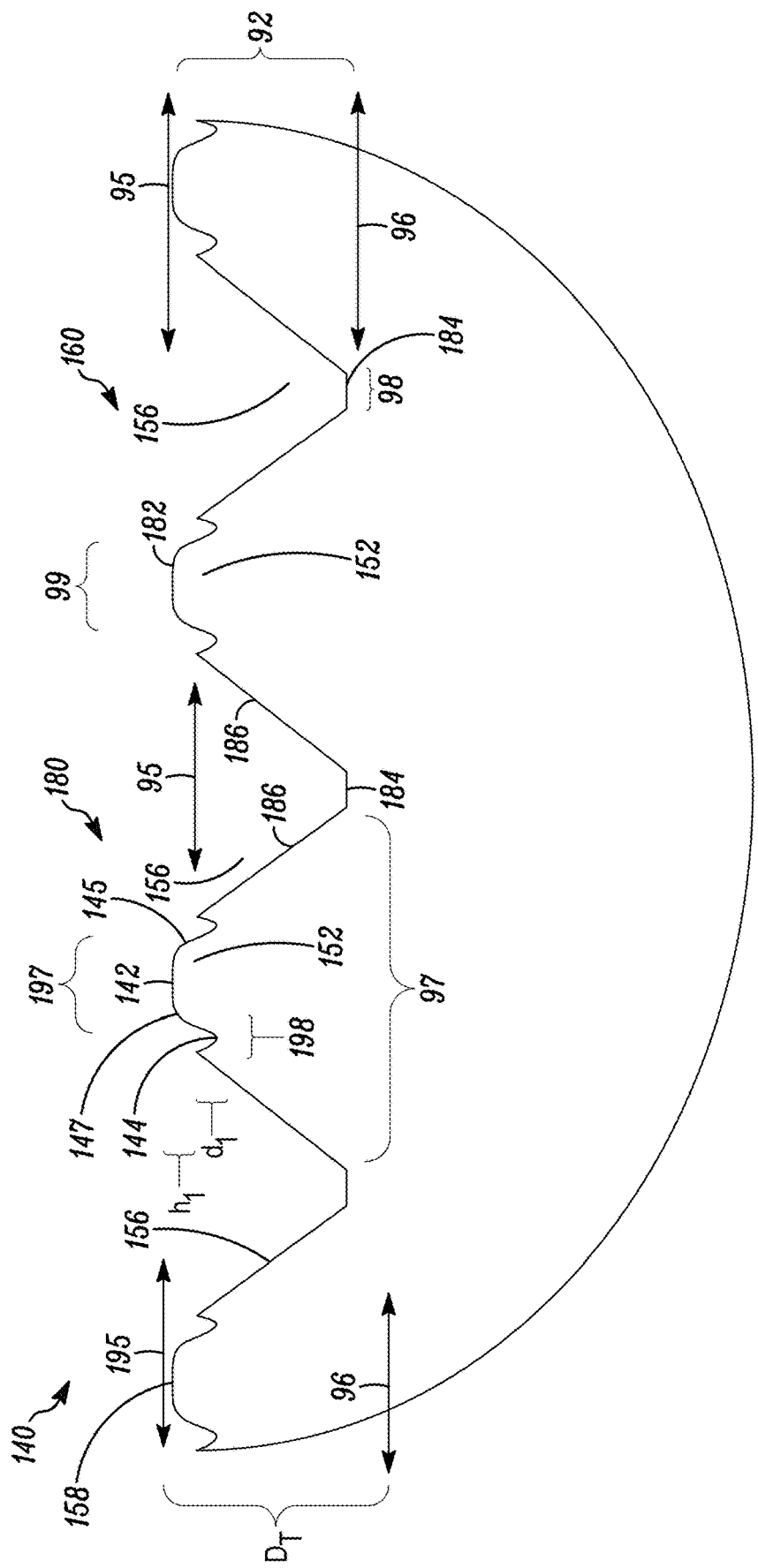
FIG. 11 is a schematic side view of a first and second patterns as shown in FIG. 5.

FIG. 11 is a schematic of the first pattern 160 as shown in FIG. 5, showing additional features of the second pattern 180 according to some embodiments. As shown in FIG. 11, tops 182 of threads lie in a first plane 95. Top surface 158 is aligned or parallel with plane 95. Bottoms 184 of indentations 156 lie in a second plane 96. In some embodiments, the tops 182 of the threads 152 have a width 99. In some embodiments, the width 99 of tops 182 of the threads 152 are as small as about 100 µm, 125 µm, 150 µm, or about 175 µm, or as great as about 200 µm, 250 µm, 275 µm, or 300 µm, or between any pair of the foregoing values. In some embodiments, the bottom 184 of each indentation 156 has a width 98. In some embodiments, the width 98 of the bottom 184 of each indentation 156 is as small as about 60 µm, 100 µm, 125 µm, or about 200 µm, or as great as about 300 µm, 400 µm, 500 µm, or 600 µm, or between any pair of the foregoing values.

As shown in FIG. 11, side walls 186 extend between the tops 182 of threads 152 and the bottom 184 of indentation 156. Generally, indentation 156 has four side walls formed by adjacent threads and an inverted pyramid shape at bottom, the four sidewalls appear as parallelogram in cross-section. In other embodiments, and depending on the shape of the indentation 156, three side walls, four side walls, or five sidewalls or more are contemplated for pattern 160. Indentation shape at bottom 184 need not affect thread direction or pattern. In some embodiments, side walls 186 are at an angle relative to plane 95 as in FIG. 9. In other embodiments, side walls 186 are perpendicular or substantially perpendicular to a plane defined by tops 182 of threads 152, such as first plane 95. In yet other embodiments, side walls 186 are perpendicular or substantially perpendicular to a plane defined by bottoms 184 of indentations 156, such as a second plane 96. In some embodiments, the side walls 186 are formed at an angle to tops 182 as small as about 1°, 10°, 15°, or 30°, or as great as about 45°, 60°, 80°, or about 90°, or between any pair of the foregoing values. That is, side walls 186 are formed at an angle to first plane 95 as small as about 1°, 10°, 15°, or 3°, or as great as about 45°, 60°, 80°, or about 90°, or between any pair of the foregoing values. In some embodiments, the side walls 186 are formed at an angle to bottom 184 as small as about 1°, 10°, 15°, or 30°, or as great as about 45°, 60°, 80°, or about 90° from the bottom, or between any pair of the foregoing values. That is, side walls 186 are formed at an angle to second plane 96 as small as about 1°, 10°, 15°, or 30°, or as great as about 45°, 60°, 80°, or about 90° from the bottom, or between any pair of the foregoing values. In some embodiments, side walls 186 are curved in relation to the first plane 95.

In some embodiments, tops 182 of threads 152 may define a plane that is curved. That is first plane 95 is optionally curved. For example, curved plane 95 corresponds to coil inner surface 16 or outer surface 18 of FIG. 1. In embodiments having first plane 95 that is curved, a depth 92 of indentations 156 may be the maximum distance between first plane 95 and bottom 184 of indentation. The particle trap 140 may have an average depth which may be defined as the average depth 92 of the indentations 156. In some embodiments, the depth 92 of indentation 156 and/or the average depth of the indentations 156 may be as small as about 300 µm, 325 µm, 350 µm, or 375 µm, or as great as about 400 µm, 550 µm, 600 µm, or 650 µm, or between any pair of the foregoing values.

As shown schematically in FIG. 11, indentations 156 define a repeating unit 97. For example, each repeating unit 97 is defined from a suitable location on an indentation 156 to a similar location on the adjacent indentation 156. In some embodiments, each repeating unit 97 may have a width. One repeating unit 97 illustrates features of pattern 180 coincident with threads 152 of pattern 160. Pattern 180 includes ridges 142 including straight or rounded top 147 and sidewalls 145. Top 147 is at least partially coincident with plane 195 and the height $h_1$ of ridge 142 is the distance between planes 95 and 195. Groove 144 has width 198 and depth $d_2$ while ridge 142 has width 197. The total distance from bottom 184 of indentation to top of ridge 147 is distance 92 plus $h_1$ or total distance $D_T$ as in FIG. 11. Total distance may also be referred to interchangeably herein as peak to valley distance. Total distance $D_T$ is dependent upon the pitch of the knurling tools for the distinct patterns. Also contributing to total distance $D_T$ is the alignment or offset of features (indentations, threads, ridges, grooves) of the distinct patterns. The pitch of the knurl grooves (for standard knurl) or threads (for inverted knurl) range from at least 15 TPI to at most 80 TPI. In some embodiments, the first pattern thread count is about 15 threads per inch to about 80 threads and the second pattern thread count is about 15 threads per inch to about 80 threads. In some embodiments, one of the first pattern and the second pattern has a thread count of about 25 threads per inch, and the other of the first pattern and the second pattern has a thread of about 80 threads per inch.

In some embodiments, as shown in FIG. 5, indentations 156 of pattern 160 have a parallelogram cross-sectional shape in a direction parallel to the surface 158. While parallelogram cross-sectional shapes are shown, other shapes are also possible for indentations 156. In some embodiments, an average depth of the indentations is from at least 150 µm to at most 600 µm. In other embodiments, an average depth of the indentations is from at least 150 µm to at most 420 µm. In some embodiments, the average depth of the indentation is about 420 µm. In some embodiments, as also shown in FIG. 5, pattern 180 includes ridges 142 having a parallelogram cross-sectional shape in a direction parallel to the surface 158. While parallelogram cross-sectional shapes are shown, other shapes are also possible for ridges 142. In some embodiments, an average height of the ridges is from at least 0 µm to at most 600 µm. In other embodiments, an average height of the ridges is from at least 150 µm to at most 420 µm. In some embodiments, the average height of the ridges is about 150 µm. The peak to valley, or total distance $D_T$, from a feature of a first pattern coincident with a feature of a second pattern from at least 150 µm to at most 600 µm. In other embodiments, the total distance $D_T$ is at least about 420 µm. In some embodiments, the total distance $D_T$ is greater than about 420 µm. In some embodiments, peak to valley or total distance $D_T$ is increased by at least 10% after a second pattern is formed as compared with only a first pattern. For example, an additional standard pattern breaks up the thread top surfaces of an inverted first pattern, thus adding surface area and possibly some height due to displacement of material in forming ridges.

In some embodiments the coil is at least one material chosen from titanium (Ti), aluminum (Al), copper (Cu), tantalum (Ta), nickel (Ni), cobalt (Co), molybdenum (Mo), gold (Au), silver (Ag), platinum (Pt), tungsten (W), chromium (Cr), a Ti alloy, an Al alloy, a Cu alloy, a Ta alloy, a Ni alloy, a Co alloy, a Mo alloy, a Au alloy, a Ag alloy, a Pt alloy, a W alloy, and a Cr alloy. In some embodiments, the trap is tantalum.

Sputtering processes may take place within a sputtering chamber. Sputtering chamber system components may include targets, target flanges, target sidewalls, shields, cover rings, coils, bosses, cups, pins and/or clamps, and other mechanical components. Often, a coil is present in these systems and/or deposition apparatuses as an inductive coupling device to create secondary plasma of sufficient density to ionize at least some of the metal atoms that are sputtered from the target. In an ionized metal plasma system, the primary plasma forms and is generally confined near the target by a magnetron, and subsequently gives rise to atoms being ejected from the target surface. The secondary plasma formed by the coil system produces ions of the material being sputtered. These ions are then attracted to the substrate by the field in the sheath that forms at the substrate surface. As used herein, the term "sheath" means a boundary layer that forms between plasma and any solid surface. This field can be controlled by applying a bias voltage to the substrate. This is achieved by placing the coil between the target and the wafer substrate and increasing the plasma density and providing directionality of the ions being deposited on the wafer substrate. Some sputtering apparatuses incorporate powered coils for improved deposition profiles including via step coverage, step bottom coverage, and bevel coverage.

Surfaces within the sputtering chamber that are exposed to plasma may incidentally become coated with sputtered material deposited on these surfaces. Material that is deposited outside the intended substrate may be referred to as back-sputter or re-deposition. Films of sputtered material formed on unintended surfaces are exposed to temperature fluctuations and other stressors within the sputtering environment. When the accumulated stress in these films exceeds the adhesion strength of the film to the surface, delamination and detachment may occur, resulting in particulate generation. Similarly, if sputtering plasma is disrupted by an electrical arc event, particulates may be formed both within the plasma, and from the surface that receives the arc force. Coil surfaces, especially those that are very flat or have sharply angular surfaces, may exhibit low adhesion strength resulting in undesirable particulate build up. It is known that particle generation during PVD is a significant cause of device failure and is one of the most detrimental factors that reduce functionality in microelectronic device yields.

Deposition of sputtering material can occur on the surfaces of sputtering coils. Coil sets generate particulate matter due to shedding from coil surfaces, especially those that are very flat or have sharply angular surfaces. During a sputtering process, often the particulates from within a sputtering chamber will be shed from the coils. To overcome this, sputtering chamber components can often be modified in a number of ways to improve their ability to function as particle traps and also reduce problems associated with particle formation.

It is desirable to develop high performing coils for use with a deposition apparatus, a sputtering chamber system and/or ionized plasma deposition system without causing shorts, plasma arcing, interruptions to the deposition process, or particle generation. Using the methods disclosed here, improved surfaces for use on a sputtering apparatus coil may be used as a particle trap to improve coil performance.

Figure 12:
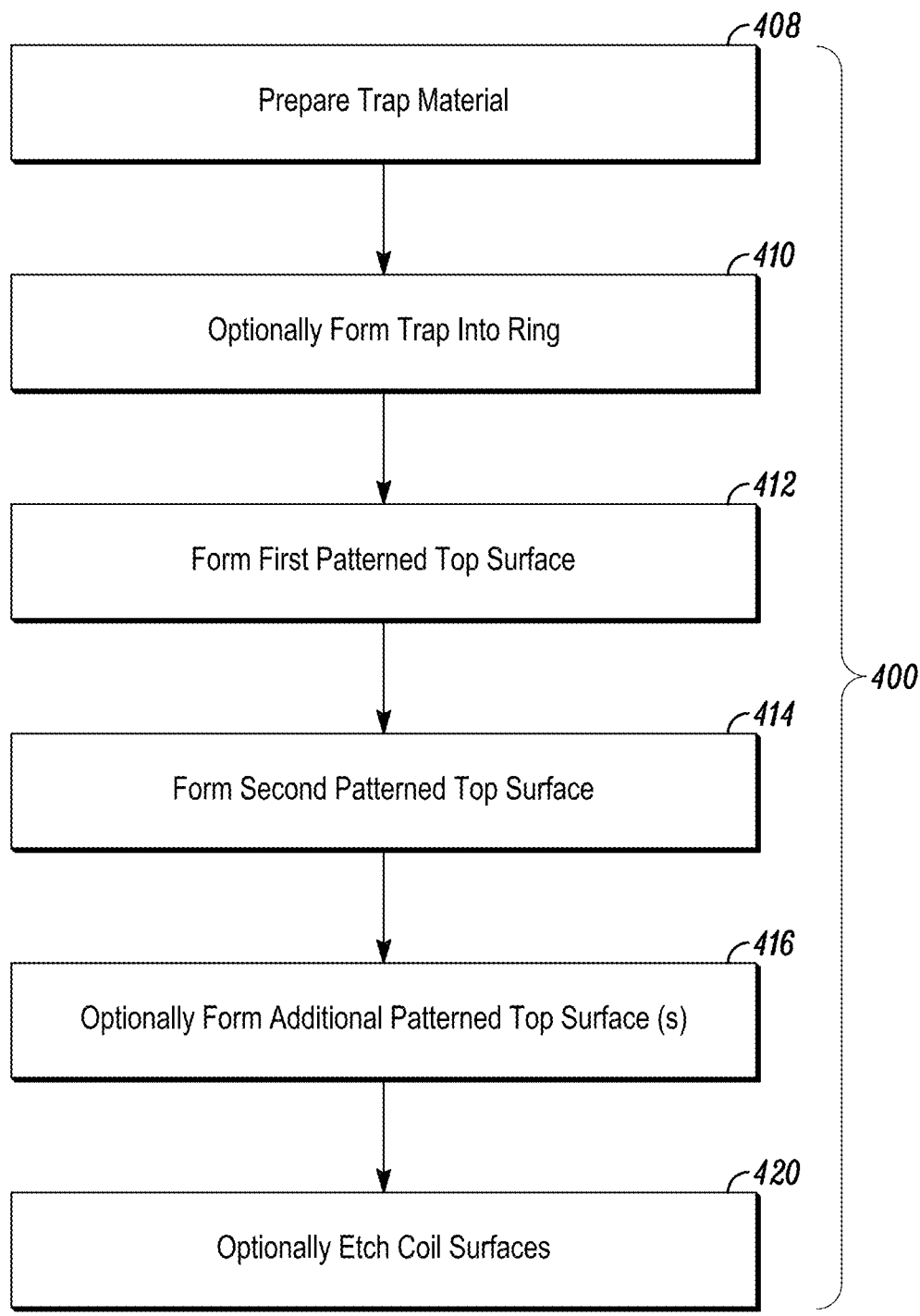
FIG. 12 is a flow chart showing an example method of forming a particle trap, according to some embodiments.

As shown in FIG. 12, a method of forming a particle trap on a sputtering chamber component is provided. The method comprises forming a first pattern on at least a portion of a surface of the sputtering chamber component, and forming a second pattern on at least a portion of the first pattern. In just one example as described herein, the first pattern 160 is a female knurl and includes a plurality of indentations with adjacent indentations separated by side walls. The indentations have a depth and a first width. The second pattern 180 is a male knurl and includes a plurality of ridges with adjacent ridges separated by grooves. The ridges have a height and a second width. The patterns are described herein as a first pattern 160 and second pattern 180 for clarity. It will be recognized that the patterns may be formed in either order. That is, in some embodiments, the second pattern 180 may be formed on at least a portion of the sputtering chamber component and the first pattern 160 may be formed on at least a portion of the second pattern 180. In this way, at least a portion of the first pattern and the second pattern are coincident. Texture may also include male over male, or female over female, of any combined pitch.

As shown in FIG. 12, the method 400 includes preparing a trap material 408, which includes selecting at least one material chosen from titanium (Ti), aluminum (Al), copper (Cu), tantalum (Ta), nickel (Ni), cobalt (Co), molybdenum (Mo), gold (Au), silver (Ag), platinum (Pt), tungsten (W), chromium (Cr), a Ti alloy, an Al alloy, a Cu alloy, a Ta alloy, a Ni alloy, a Co alloy, a Mo alloy, a Au alloy, a Ag alloy, a Pt alloy, a W alloy, and a Cr alloy. Materials suitable for sputtering targets according to embodiments of the present disclosure include pure elements and alloys. For example, suitable sputtering materials for a sputtering target include at least one material chosen from Ti, Al, Cu, Ta, Ni, Co, Mo, Au, Ag, Pt, W, Cr, a Ti alloy, an Al alloy, a Cu alloy, a Ta alloy, a Ni alloy, a Co alloy, a Mo alloy, a Au alloy, a Ag alloy, a Pt alloy, a W alloy, and a Cr alloy. In some embodiments, for targets made of a single element, such as materials chosen from elemental Ti, Al, Cu, Ta, Ni, Co, Mo, Au, Ag, Pt, W, and Cr, the sputtering target is substantially pure or pure. Substantially pure means nearly pure or at least 99.9% by weight elemental content. For example, a suitable sputtering material for a sputtering target can include at least one substantially pure material chosen from Ti, Al, Cu, Ta, Ni, Co, Mo, Au, Ag, Pt, W, and Cr. In other embodiments, the sputtering material of the sputtering target is an alloy. An alloy includes a main element mixed with at least one other element from the periodic table, wherein the sputtering material contains a higher quantity of the main element than the one or more elements with which it is mixed. According to standard naming convention, an alloy may be referenced as an alloy of the main element. For example, an alloy in which the main element is Al is referenced as an Al alloy. Suitable sputtering materials for a sputtering target can include at least one main element chosen from Ti, Al, Cu, Ta, Ni, Co, Mo, Au, Ag, Pt, W, and Cr. Such materials may be referred to as a Ti alloy, an Al alloy, a Cu alloy, a Ta alloy, a Ni alloy, a Co alloy, a Mo alloy, a Au alloy, a Ag alloy, a Pt alloy, a W alloy, and a Cr alloy, respectively. In some embodiments, the material for a sputtering target chosen is tantalum.

The prepared trap or coil material may optionally be formed into a ring in step 410. Method 400 further includes forming a first patterned top surface in step 412. In one non-limiting example, the first patterned top surface is an inverted (female) knurl surface having indentations in a repeated arrangement (as in pattern 260 of portion A of FIG. 6) onto the surface the component (i.e. trap or coil), which has been optionally formed into a ring in step 410. The indentations may be shaped as inverted pyramids with the base of each inverted pyramid parallel to the surface and the apex of each inverted pyramid oriented into the surface and wherein the height of each inverted pyramid defines the depth of each indentation of the plurality of indentations. A first pattern is formed, for example, by pressing a first knurling tool into the sputtering chamber component. In some embodiments, an average depth of the indentations is from about 330 μm to about 600 μm.

Method 400 further includes forming a second patterned top surface onto the same surface as the first patterned top surface as in step 414. The second pattern may be, in a non-limiting example, a standard (male) knurl surface or ridges in a repeated arrangement, i.e. second pattern 280 on at least a portion (as in pattern 280 coincident with pattern 260 as shown in portion B of FIG. 6) of the first knurled surface. The second pattern 280 is formed, for example, by pressing a second knurling tool into the sputtering chamber component. In some embodiments, an average height of the ridges is from about 0 μm to 600 μm. Optionally, as in step 416, at least one additional patterned top surface is formed onto the coincident first and second pattered top surfaces. Optionally, the trap may be etched, as in step 420, as is known in the art. Etching step 420 includes but is not limited to chemical or plasma etching to clean or remove residue without significant change the surface characteristics of the first and second patterns. Advantageously, method 400 does not require grit blasting or wire brushing of either knurl pattern.

Figure 13:
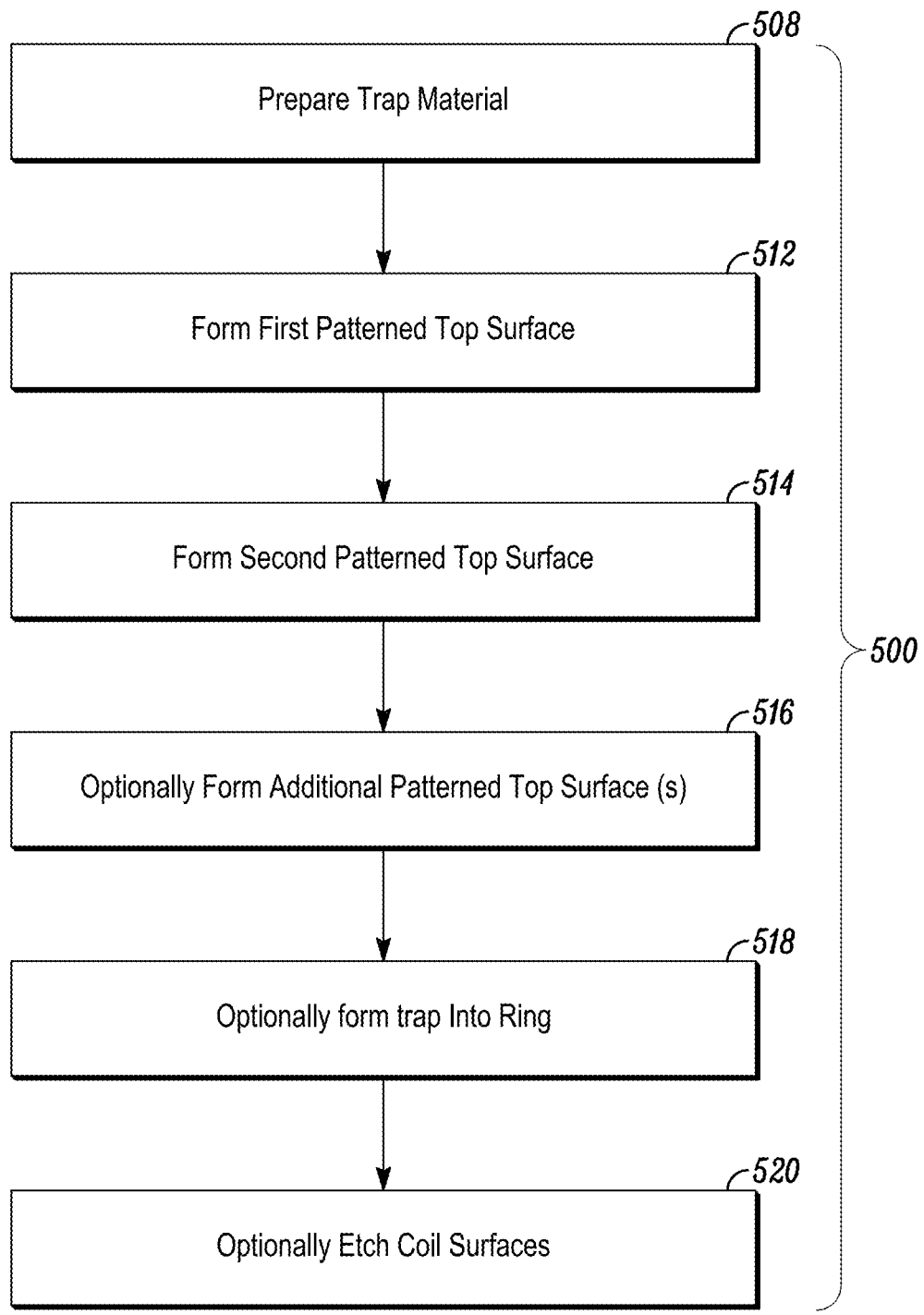
FIG. 13 is a flow chart showing another example method of forming a particle trap, according to other embodiments.

FIG. 13 illustrates method 500, which is similar to method 400 the trap may be optionally formed into a ring in step 518, after forming at least first and second patterned top surfaces. Method 500 includes forming a first patterned top surface in step 512. Method 500 includes forming a second patterned top surface onto the same surface as the first patterned top surface as in step 514. Optionally, as in step 516, at least one additional patterned top surface is formed onto the coincident first and second pattered top surfaces. The trap may be optionally formed into a ring as in step 518. Optionally, the trap may be further etched, as in step 520, as is known in the art. Etching step 520 includes but is not limited to chemical or plasma etching to clean or remove residue without significant change the surface characteristics of the first and second patterns. Advantageously, method 500 does not require grit blasting or wire brushing of either knurl pattern.

For methods 400 and 500, the first pattern comprises one of (i) a plurality of first indentations arranged in a repeating pattern with adjacent first indentations separated by side walls, the first indentations having a first depth and a first width, and (ii) a plurality of first ridges arranged in a repeating pattern with adjacent first ridges separated by grooves, the first ridges having a first height and a first width. For methods 400 and 500, the second pattern comprises one of (i) a plurality of second indentations arranged in a repeating pattern with adjacent second indentations separated by side walls, the second indentations having a second depth and a second width, and (ii) a plurality of second ridges arranged in a repeating pattern with adjacent second ridges separated by grooves, the second ridges having a second height and a second width.

Features of the first and second patterns, i.e. indentations and ridges or threads and grooves, may be offset from one another in a repeated arrangement. Alternatively, the features of the first and second patterns may be aligned or coincident relative to one another. Alignment of patterns can include, for example, that threads in a first direction are parallel and offset relative to grooves in a third direction. In some embodiments, the first and third directions are the same. Alternatively or in addition to, threads in a second direction are parallel and offset relative to grooves in a fourth direction. In some embodiments, the second and fourth directions are the same.

In some embodiments, methods 400 and 500 include repeated knurling as in any of steps 412, 414, 512, and 514. Repeated knurling is useful to form repeated patterns (i.e. pattern 160 and/or pattern 180) over a larger surface of the component or coil.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

The following is claimed:

1. A sputtering chamber component comprising a particle trap, the particle trap comprising:
   a first pattern formed on at least a portion of a surface of the particle trap, the first pattern arranged in a repeating pattern having a first pattern thread count, the first pattern having a first pattern top surface and comprising first indentations having a first depth and separated by first and second threads, the first and second threads having first and second thread top surfaces that form the first pattern top surface; and
   a second pattern formed on at least a portion of the first pattern top surface, the second pattern arranged in a repeating pattern having a second thread count, the second pattern having a second pattern top surface and comprising second indentations having a second depth and separated by third and fourth threads, the third and fourth threads having third and fourth thread top surfaces configured to form the second pattern top surface
   wherein:
   the first threads extending in a first direction form side walls separating adjacent first indentations in a second direction, the second direction at an angle of greater than 0 and less than 180 degrees to the first direction, and the second threads extending in the second direction form side walls separating adjacent first indentations in the first direction; and
   the third threads extending in a direction parallel to the first direction form side walls separating adjacent second indentations in a direction parallel to the second direction, and the fourth threads extending in the direction parallel to the second direction form side walls separating adjacent second indentations in the direction parallel to the first direction.

2. The sputtering chamber particle trap of claim 1, wherein the first pattern thread count is about 15 threads per inch to about 80 threads per inch and the second pattern thread count is about 15 threads per inch to about 80 threads per inch.

3. The sputtering chamber particle trap of claim 1, further comprising a third pattern formed on at least a portion of the first and second patterns.

4. The sputtering chamber particle trap of claim 3, further comprising at least one additional pattern formed on at least a portion of the third pattern.

5. The sputtering chamber particle trap of claim 1, wherein an average depth of at least one of the first and second indentations is from about 330 μm to about 600 μm.

6. The sputtering chamber particle trap of claim 1, wherein the sputtering chamber particle trap is formed from at least one material chosen from tantalum (Ta), titanium (Ti), aluminum (Al), copper (Cu), nickel (Ni), cobalt (Co), molybdenum (Mo), gold (Au), silver (Ag), platinum (Pt), tungsten (W), chromium (Cr), a tantalum (Ta) alloy, a titanium (Ti) alloy, an aluminum (Al) alloy, a copper (Cu) alloy, a nickel (Ni) alloy, a cobalt (Co) alloy, a molybdenum (Mo) alloy, a gold (Au) alloy, a silver (Ag) alloy, a platinum (Pt) alloy, a tungsten (W) alloy, and a chromium (Cr) alloy.

7. A sputtering chamber component comprising a particle trap, the particle trap comprising:
   a first pattern formed on at least a portion of a surface of the particle trap, the first pattern arranged in a repeating pattern having a first pattern thread count, the first pattern having a first pattern top surface and comprising first indentations having a first depth and separated by first and second threads, the first and second threads having first and second thread top surfaces that form the first pattern top surface; and
   a second pattern formed on at least a portion of the first pattern top surface, the second pattern arranged in a repeating pattern having a second thread count, the second pattern having a second pattern top surface and comprising second indentations having a second depth and separated by third and fourth threads, the third and fourth threads having third and fourth thread top surfaces configured to form the second pattern top surface,
   wherein:
   the first threads extending in a first direction form side walls separating adjacent first indentations in a second direction, the second direction at an angle of greater than 0 and less than 180 degrees to the first direction, and the second threads extending in the second direction form side walls separating adjacent first indentations in the first direction; and
   the third grooves extending in a direction parallel to the first direction form side walls separating adjacent second ridges in a direction parallel to the second direction, and the fourth grooves extending in the direction parallel to the second direction form side walls separating adjacent second ridges in the direction parallel to the first direction.

8. The sputtering chamber particle trap of claim 7, wherein the first pattern thread count is about 15 threads per inch to about 80 threads per inch and the second pattern thread count is about 15 threads per inch to about 80 threads per inch.

9. The sputtering chamber particle trap of claim 7, further comprising a third pattern formed on at least a portion of the first and second patterns.

10. The sputtering chamber particle trap of claim 7, wherein an average depth of at least one of the first and second indentations is from about 330 μm to about 600 μm.

11. The sputtering chamber particle trap of claim 7, wherein an average height of at least one of the first and second ridges is from about 0 μm to about 600 μm.

12. A sputtering chamber component comprising a particle trap, the particle trap comprising:
   a first pattern formed on at least a portion of a surface of the particle trap, the first pattern arranged in a repeating pattern having a first pattern thread count, the first pattern having a first pattern top surface and comprising first ridges having a first height and separated by first and second grooves, the first ridges having first ridge top surfaces that form the first pattern top surface; and
   a second pattern formed on at least a portion of the first pattern top surface, the second pattern arranged in a repeating pattern having a second thread count, the second pattern having a second pattern top surface and comprising second ridges having a second height and separated by third and fourth grooves, the second ridges having second ridge top surfaces configured to form the second pattern top surface,
   wherein:
   the first grooves extending in a first direction form side walls separating adjacent first ridges in a second direction, the second direction at an angle of greater than 0 and less than 180 degrees to the first direction, and the second grooves extending in the second direction form side walls separating adjacent first ridges in the first direction; and the third grooves extending in a direction parallel to the first direction form side walls separating adjacent second ridges in a direction parallel to the second direction, and the fourth grooves extending in the direction parallel to the second direction form side walls separating adjacent second ridges in the direction parallel to the first direction.

13. The sputtering chamber particle trap of claim 12, wherein the first pattern thread count is about 15 threads per inch to about 80 threads per inch and the second pattern thread count is about 15 threads per inch to about 80 threads per inch.

14. The sputtering chamber particle trap of claim 12, further comprising a third pattern formed on at least a portion of the first and second patterns.

15. The sputtering chamber particle trap of claim 12, wherein an average height of at least one of the first and second ridges is from about 0 μm to about 600 μm.

16. A sputtering chamber component comprising a particle trap, the particle trap comprising:
a first pattern formed on at least a portion of a surface of the particle trap, the first pattern arranged in a repeating pattern having a first pattern thread count, the first pattern having a first pattern top surface and comprising first ridges having a first height and separated by first and second grooves, the first ridges having first ridge top surfaces that form the first pattern top surface; and
a second pattern formed on at least a portion of the first pattern top surface, the second pattern arranged in a repeating pattern having a second thread count, the second pattern having a second pattern top surface and comprising second ridges having a second height and separated by third and fourth grooves, the second ridges having second ridge top surfaces configured to form the second pattern top surface, wherein:

the first grooves extending in a first direction form side walls separating adjacent first ridges in a second direction, the second direction at an angle of greater than 0 and less than 180 degrees to the first direction, and the second grooves extending in the second direction form side walls separating adjacent first ridges in the first direction; and the third threads extending in a direction parallel to the first direction form side walls separating adjacent second indentations in a direction parallel to the second direction, and the fourth threads extending in the direction parallel to the second direction form side walls separating adjacent second indentations in the direction parallel to the first direction.

17. The sputtering chamber particle trap of claim 16, wherein the first pattern thread count is about 15 threads per inch to about 80 threads per inch and the second pattern thread count is about 15 threads per inch to about 80 threads per inch.

18. The sputtering chamber particle trap of claim 16, further comprising a third pattern formed on at least a portion of the first and second patterns.

19. The sputtering chamber particle trap of claim 16, wherein an average depth of at least one of the first and second indentations is from about 330 μm to about 600 μm.

20. The sputtering chamber particle trap of claim 16, wherein an average height of at least one of the first and second ridges is from about 0 μm to about 600 μm.

\* \* \* \* \*